(12) United States Patent
Usami

(10) Patent No.: US 7,863,718 B2
(45) Date of Patent: Jan. 4, 2011

(54) ELECTRONIC TAG CHIP

(75) Inventor: Mitsuo Usami, Tachikawa (JP)

(73) Assignee: Hitachi, Ltd., Tokyo (JP)

( * ) Notice: Subject to any disclaimer, the term of this patent is extended or adjusted under 35 U.S.C. 154(b) by 781 days.

(21) Appl. No.: 11/719,693

(22) PCT Filed: Feb. 16, 2005

(86) PCT No.: PCT/JP2005/002837

§ 371 (c)(1),
(2), (4) Date: May 18, 2007

(87) PCT Pub. No.: WO2006/087822

PCT Pub. Date: Aug. 24, 2006

(65) Prior Publication Data

US 2009/0140300 A1    Jun. 4, 2009

(51) Int. Cl.
*H01L 23/00* (2006.01)

(52) U.S. Cl. ............... 257/679; 257/531; 257/E23.064; 257/E23.176; 257/922

(58) Field of Classification Search ................. 257/679, 257/531, E23.064, E23.176, E21.02, 922
See application file for complete search history.

(56) References Cited

U.S. PATENT DOCUMENTS

| | | | |
|---|---|---|---|
| 5,420,458 A | 5/1995 | Shimoji | |
| 5,663,597 A | 9/1997 | Nelson et al. | |
| 6,657,542 B2 * | 12/2003 | Usami | 340/572.8 |
| 7,271,076 B2 * | 9/2007 | Yamazaki et al. | 438/458 |
| 2001/0008296 A1 * | 7/2001 | Gelsomini et al. | 257/500 |

FOREIGN PATENT DOCUMENTS

| | | |
|---|---|---|
| EP | 0316799 | 5/1999 |
| JP | 04-352470 | 12/1992 |
| JP | 06-064379 | 3/1994 |
| JP | 6-283658 | 10/1994 |
| JP | 8-335709 | 12/1996 |
| JP | 11-054548 A | 2/1999 |
| JP | 2000-299440 | 10/2000 |
| JP | 2001-230425 | 8/2001 |

(Continued)

OTHER PUBLICATIONS

Usami et al, "Power LSI: an ultra small RF identification chip for individual recognition applications", Solid-State Circuits Conference 2003, Digest of Technical Papers, ISSCC 2003 IEEE International, San Francisco, CA, Feb. 9-13, 2003.

(Continued)

*Primary Examiner*—Victor A Mandala
*Assistant Examiner*—Scott Stowe
(74) *Attorney, Agent, or Firm*—Mattingly & Malur, P.C.

(57) ABSTRACT

In order to extend the communication distance of an electronic tag chip, it is required to reduce power consumption of the electronic tag chip. After having formed capacitors and diodes on an SOI (Silicon on Insulator), remove a silicon substrate of the SOI. It becomes possible to reduce the capacitors and diodes of the electronic tag chip in parasitic capacitance relative to the ground, which makes it possible to reduce the power consumption of the electronic tag chip, thereby enabling the electronic tag chip to increase in communication distance thereof.

3 Claims, 17 Drawing Sheets

FOREIGN PATENT DOCUMENTS

| | | |
|---|---|---|
| JP | 2004-362190 | 12/2004 |
| JP | 2004-363415 A | 12/2004 |
| KR | 10-0306988 | 12/2001 |
| KR | 2002-0042631 A | 6/2002 |
| WO | WO 01/09640 | 2/2001 |

OTHER PUBLICATIONS

Villard, P. et al, "A low-voltage mixed-mode CMOS/SOI integrated circuit for 13.45 MHz RFID applications", 2002 IEEE International SOI Conference Proceedings, Williamsburg, VA, Oct. 7-10, 2002.

* cited by examiner

FIG.6
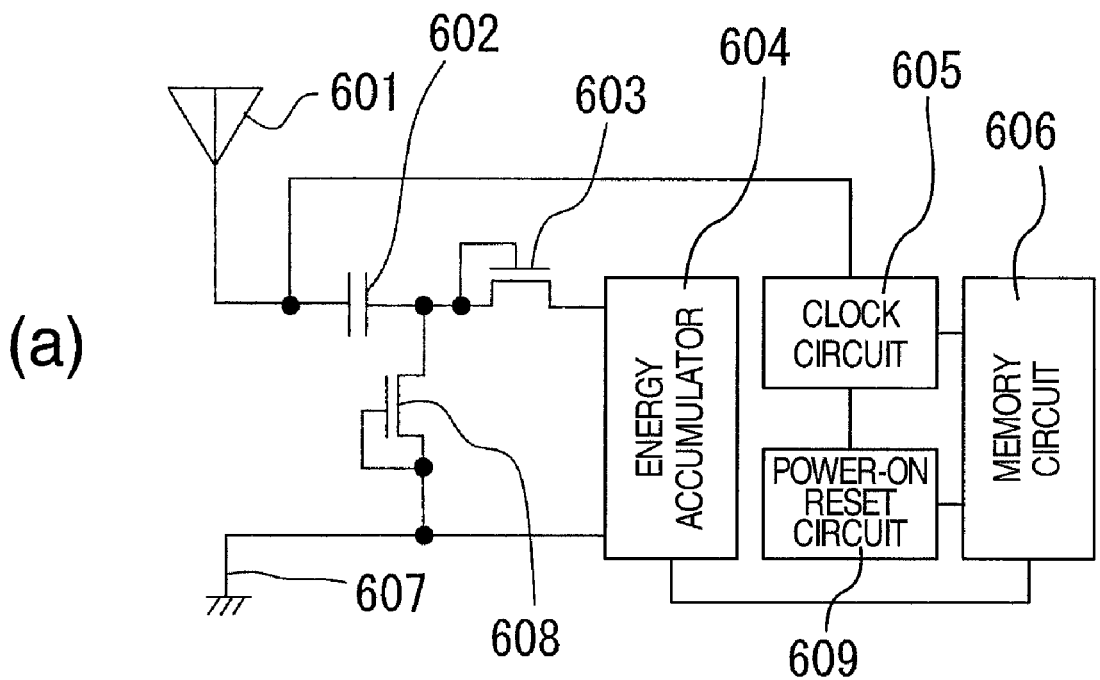
(a)
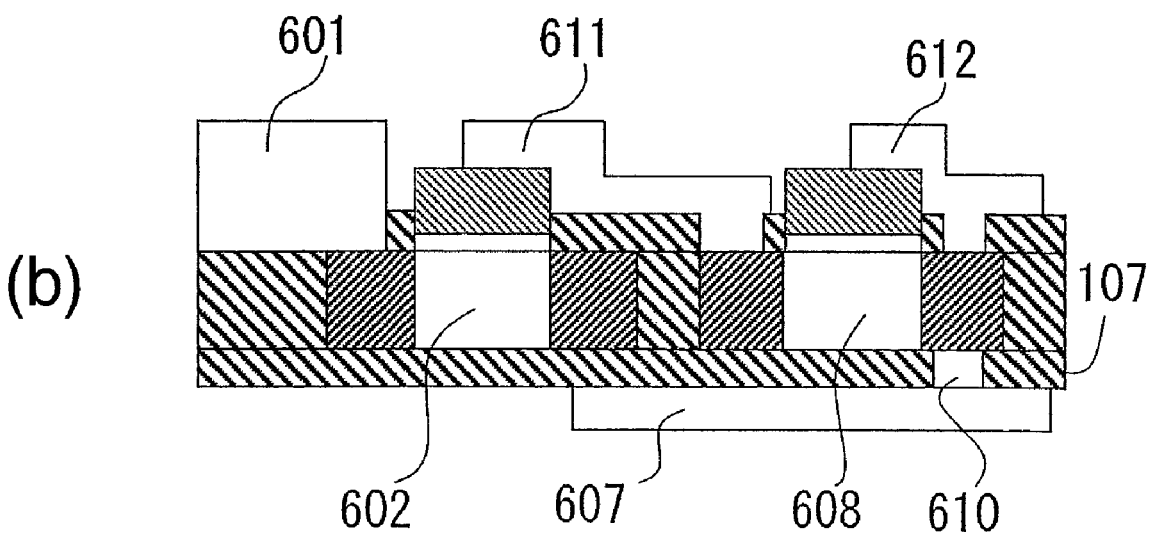
(b)

FIG. 12
(a) 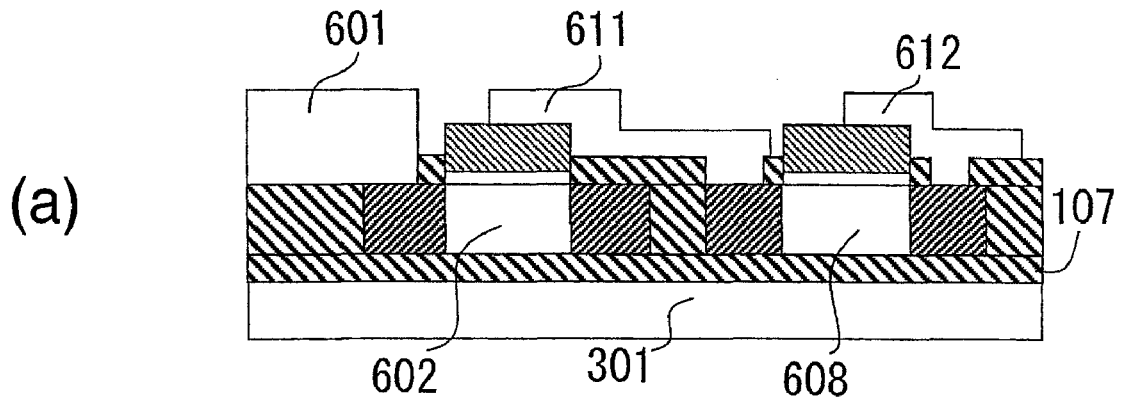
(b) 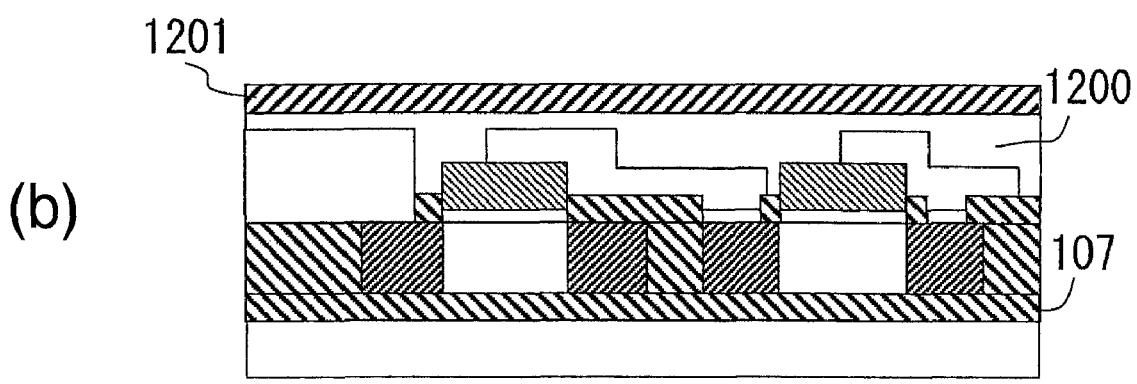
(c) 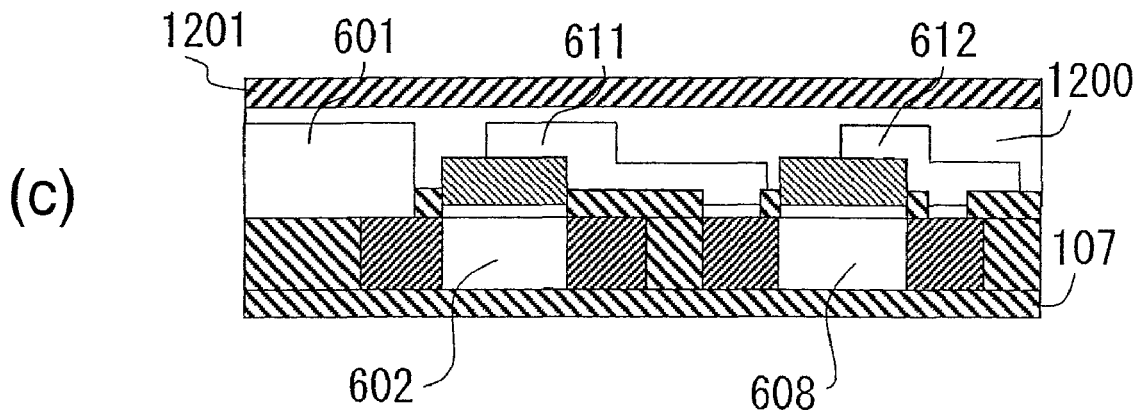

FIG.13
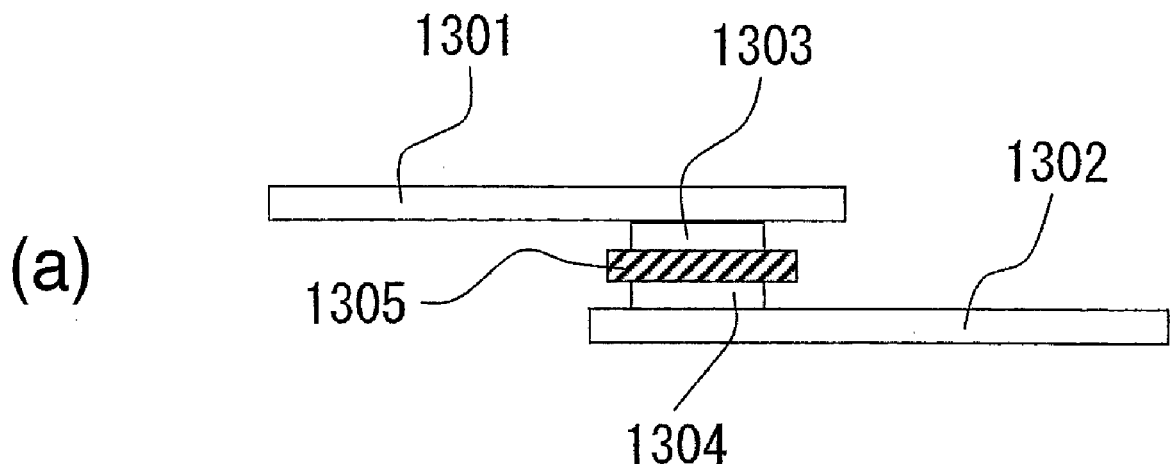
(a)
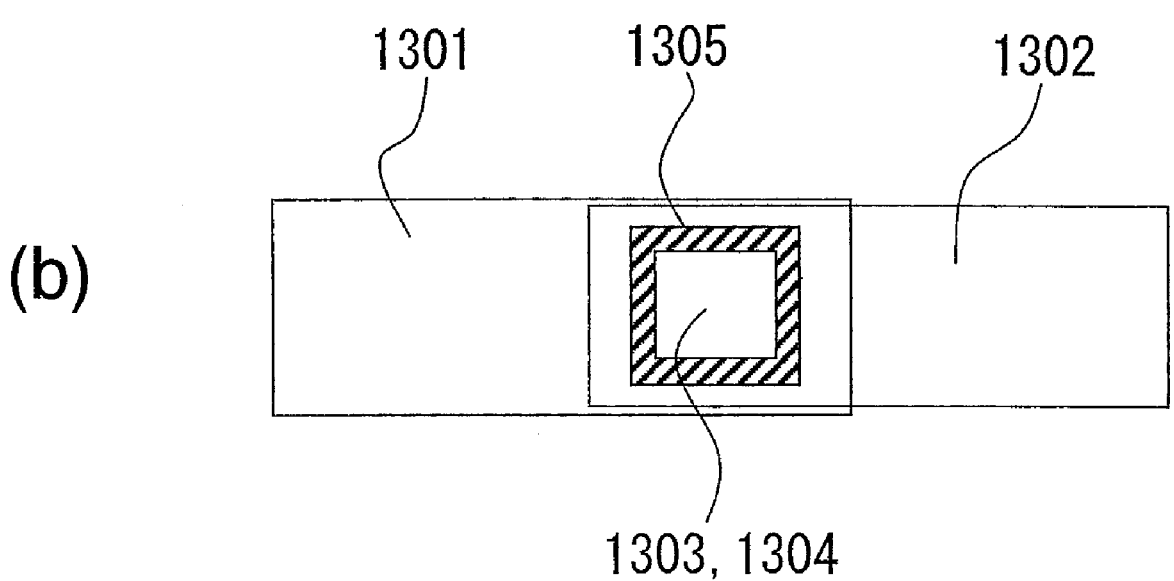
(b)

FIG.15
(a) 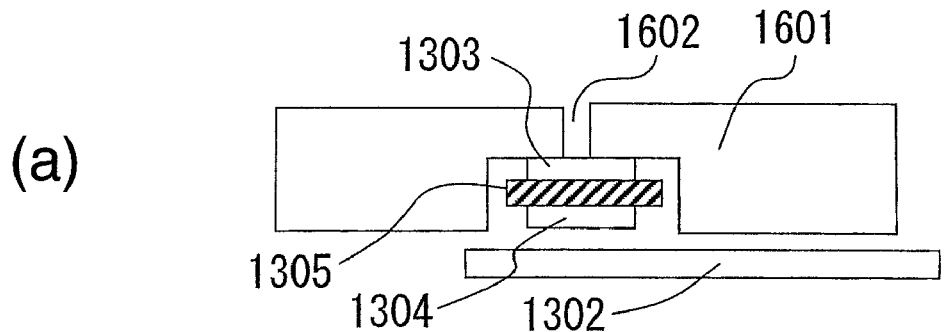
(b) 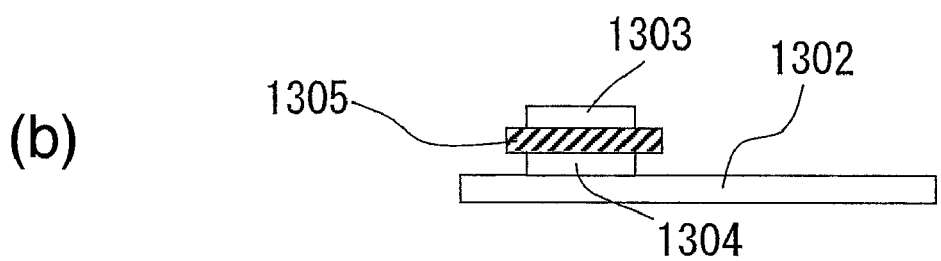
(c) 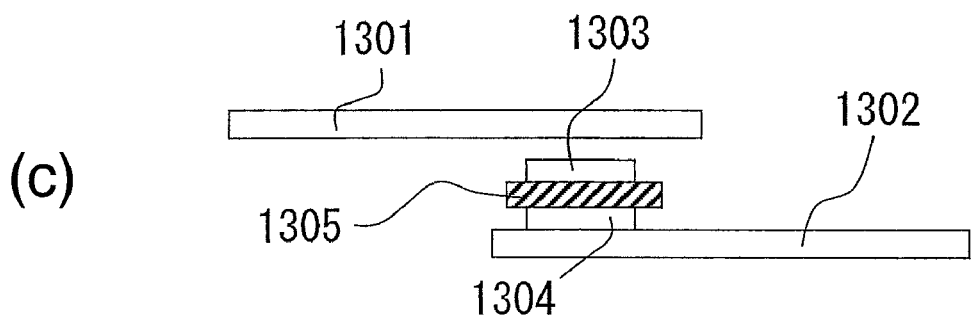
(d) 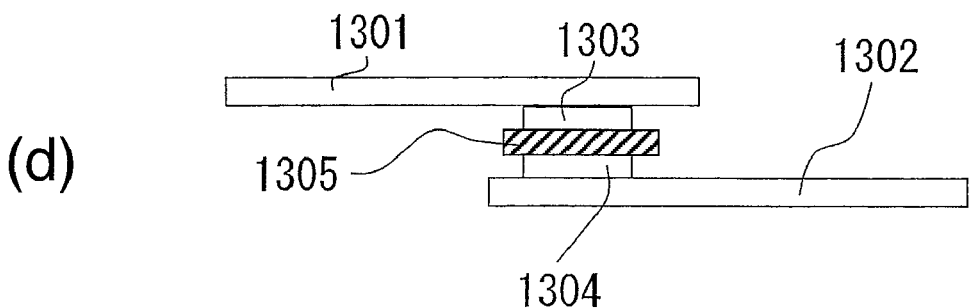

US 7,863,718 B2

ELECTRONIC TAG CHIP

TECHNICAL FIELD

The present invention relates to IC chips adaptable for use in electronic tags which perform identification via radio waves.

BACKGROUND ART

RFID (Radio Frequency Identification) has attracted attention as a scheme for identifying and managing persons and things by using ultra-small wireless radio chips. In a RFID device, an ultrasmall tag (i.e., RFID tag) stores therein data for performing identification by communication with a reader device via either electric waves or electromagnetic waves. The RFID tag is comprised of an IC chip which stores therein information such as an ID code of itself, and has an ability to use electric waves to transmit and receive information to and from a management system. In recent years, battery-less tags are commercially available by virtue of techniques for non-contact power transmission from the antenna side.

Regarding radio IC tag circuits and devices, JP-A-2000-299440 discloses therein a high-frequency operable voltage generator circuit which is designed to give electric power to an SOI (silicon-on-insulator) structure MOSFET by way of a resistor to thereby preclude influence from a parasitic-coupling diode.

Additionally JP-A-8-335709 discloses therein a technique for reducing a threshold voltage by providing an electrical connection in such a way that the gate of a MOS transistor formed on an SOI substrate is kept identical in potential level to a substrate as taken through an n+ diffusion region. It further discloses that etching is done up to an SiO$_2$ film with etch stop applied thereto during chemical etching, for electrical separation of the MOS transistor on the same supporting substrate to thereby form a MOS transistor having air-isolation. There is also disclosed a technique for providing a connection so that the gate-substrate potential is equal to the potential of a drain, thereby causing it to have rectification characteristics for fabrication of a diode bridge or a mixer.

On the other hand, an object of the present invention is to extend the communication distance of a radio IC tag chip. In particular, by applying it to radio IC tag chips which have no internal power supplies and are operable with electric power as received from a reader/writer, it is possible to obtain superior effects and advantages.

DISCLOSURE OF THE INVENTION

Solving Means

Generally, the distance which electrical waves travel is proportional to transmission power. Accordingly, for internal battery-less RFID tags operable with electric power as received from reader/writer equipment, it is desirable in order to extend the transmission distance to efficiently utilize the power received form the reader/writer as the transmission power thereof.

In RFID, a rectification circuit exists for converting an AC signal from the reader/writer into a DC voltage. As radiant electromagnetic waves are such that the energy of the wave is attenuated in a way proportional to the distance squared, a fourfold increase of power consumption results in the communicable distance being half reduced. Whereas, in order to doubly extend the communication distance, it is a necessary to lessen the power consumption to one-fourth (¼). In cases where capacitors and MOSFETs making up this rectifier circuit accompany parasitic capacitance components relative to the ground potential, a current that leaks to the ground can occur, resulting in a decrease in output voltage. Letting this rectifier circuit decrease in parasitic capacitance is effective in extending the transmission distance of RFID devices.

FIG. 2 shows a configuration of a MOSFET which is fabricated on an SOI substrate. An oxide film 107 is present on a back-surface silicon substrate 100 of the SOI. On the oxide film 107, an anode 101 is connected to a polysilicon 102 and a drain diffusion layer 106. Numeral 110 designates a depletion layer. A gate oxide film 103 plays an important role for determination of the forward direction voltage of a diode. A diode current flows from the anode 101 to a cathode 104 through a source diffusion layer 108. The diode is separated by an element isolation film 105. With this structure, parasitic capacitance takes place between adjacent ones of the source diffusion layer 108, a body layer 109, the drain diffusion layer 106 and the silicon substrate 100, resulting in coupling with a ground layer which overlies the oxide film 107 via the silicon substrate 100. Due to this, a leakage current is generated from the cathode 104 to the silicon substrate, resulting in an unwanted increase in power consumption.

Usually, in the case where a silicon substrate is used, this becomes a ground layer. However, in the SOI substrate, the oxide film 107 exists, so it is unnecessary to electrically fix the silicon substrate 100 at a certain potential level. Additionally, the SI substrate is such that in CMOS, any high-resistance substrate is not usable for latch-up prevention purposes. Therefore, it has little choice but to become a low-resistance substrate. As such, there is a disadvantage that parasitic capacitance coupling tends to readily occur between elements.

In the SOI substrate, there is a advantage that the coupling is suppressed by reducing the parasitic capacitance and also enlarging the resistance value of the silicon substrate 100. Although an SI substrate offers a superior advantage of low cost production over SOI substrates when considering wafer material only, there are advantages regarding SOI substrates with respect to the ability to form a chip having a small size to thereby increase the number of chips produced from a wafer and also reduce cost.

FIG. 3 shows an exemplary MOS capacitor as fabricated on an SI substrate. This is a capacitance of about 20 to 100 pF, for example. A first MOS capacitor electrode 301 is connected to an N-type diffusion layer 306. A second MOS capacitor electrode 304 is coupled to a polysilicon 302, with a gate oxide film 303 existing beneath it. The N-type diffusion layer 306 is separated by an isolation oxide film 305. This is a P-type silicon substrate 300 so that an N-type channel layer 309 is present immediately beneath the gate oxide film. A problem of this structure is as follows: in the case where the first MOS capacitor electrode 301 is used as an input terminal of the capacitor of a rectification circuit, an AC waveform is applied thereto. Thus, a negative or "minus" potential is applied in some events when the silicon substrate is grounded, causing the P-type silicon substrate 300 and N-type diffusion layer 306 to become in the forward direction, resulting in the flow of a large amount of current, which leads to the failure of the configuration to function as a capacitor. Alternatively, in the case where the second MOS capacitor electrode 304 is set as an input, the second MOS capacitor electrode 304 becomes a minus potential, resulting in generation of a depletion layer, which also leads to the failure of the configuration to effectively function as the capacitor.

When the MOS capacitor electrode 304 has a negative potential, the electrical charge carriers in the channel region become depleted, causing unintentional establishment of an electrically isolated state. This leads to an increase in interelectrode distance out of the dielectric constant, electrode area and interelectrode distance, which determine a MOS capacitance value and thus forces the MOS capacitance value to decrease accordingly. If this MOS capacitance value is small then a risk arises therefrom as to an increase in the input voltage required to obtain an operating voltage within the chip—i.e., an input voltage which enters the chip from an antenna, resulting in the electronic tag being operable only at a limited distance with a large energy of electromagnetic wave coming from a short-range reader, thereby causing the electronic tag to suffer from performance degradation.

FIG. 4 is a diagram showing a MOS capacitor fabricated on a SOI substrate. A first MOS capacitor electrode 301 is connected to an N-type diffusion layer 306 while a second MOS capacitor electrode 304 is coupled to a polysilicon 302 with a gate oxide film 303 underlying it. The N-type diffusion layer 306 is separated by an isolation oxide film 305. An N-type channel layer 309 exists immediately under the gate oxide film. An oxide film 307 exists just beneath the N-type diffusion layer 306 and an N-type channel layer 309. An advantage of this structure is that in case the first MOS capacitor electrode 301 is used as an input node of the capacitance of a rectifier circuit, an AC waveform is applied thereto, whereby a minus potential is applied when the silicon substrate is grounded so that a large current flows in the forward direction, resulting in the chip being instantly destroyed in some events. However, due to the presence of the oxide film 307, it hardly happens that the silicon substrate 300 gives rise to parasitic effects. In addition, since it is possible to use as the input the MOS capacitor electrode 301 rather than the second MOS capacitor electrode 304, the second MOS capacitor electrode 302 becomes a positive or "plus" potential, resulting in accumulation of carriers in the channel layer 309 to thereby enable it to effectively function as the capacitor.

Consequently, in the present invention, it is an object to provide rectification circuitry adaptable for use in electronic tags which perform recognition via radio waves. More specifically, it is an object of the invention to permit MOSFETs in the rectifier circuitry to decrease in parasitic capacitance.

A brief summary of a representative one of inventive concepts as disclosed herein will be explained below.

A radio-frequency component is provided, which performs arranging of more than one MOS capacitor and diode by use of an SOI substrate and further removes a silicon substrate to thereby constitute an electronic tag. In order to arrange the MOS capacitor and diode on an oxide film, let it have a high density arrangement with parasitic capacitance being reduced, thereby substantially eliminating the presence of any silicon substrate which underlies an oxide film so that interaction with respect to the ground is excluded. This has an advantageous effect of providing low power consumption.

The silicon substrate of an SOI wafer is removed in order to reduce the parasitic capacitance between the ground and source/drain diffusion layers of the MOS transistors of an IC chip of the electronic tag for performing wireless recognition in microwave bands.

While the SOI is effective in the parasitic capacitance reduction, those devices which are under requirements for further low power consumption, such as IC chips of the electronic tags, are required to avoid ground coupling through the substrate of an SOI wafer in view of the radio frequency operability thereof. To this end, the silicon substrate of the SOI wafer is removed, thereby making it possible to exclude the ground coupling. This in turn enables the electronic tag IC chips to operate with low power consumption.

Accordingly, a representative arrangement of the present invention is a semiconductor device which is formed using an SOI wafer the formation of a MOS diode or MOS capacitor making up a rectifier circuit of an electronic tag chip and removing a silicon layer on the back surface thereof.

One example is such that a diffusion layer of the MOS diode is deep enough to reach a buried oxide film of the SOI wafer.

Another example is characterized in that the formation of a MOS capacitor is done at sidewalls of an electrical wiring lead(s).

Still another example is a semiconductor device which has a rectifier circuit made up of semiconductor circuit elements and is operable with an output of the rectifier circuit as its power supply voltage, wherein the semiconductor elements making up the rectifier circuit are disposed on a supporting substrate that is comprised of a dielectric monolayer. Yet another example is an RFID tag having a rectifier circuit connected to an antenna terminal for using an output of the rectifier circuit as its power supply voltage to give off a radio-wave signal, wherein the semiconductor elements making up the rectifier circuit are disposed to overlie a support substrate made of a dielectric monolayer.

BRIEF DESCRIPTION OF THE DRAWINGS

FIG. 6 is a block diagram of an entirety of an electronic tag, and FIG. 6 is an element sectional diagram.

FIG. 12 is sectional diagram showing some major steps in a fabrication process of an electronic tag.

FIGS. 13(a) and 13(b) are diagrams of an electronic tag of the double-faced electrode type.

FIG. 15 is a sectional diagram showing fabrication process steps of a double-face electrode type electronic tag.

BEST MODE FOR CARRYING OUT THE INVENTION

Figure 1:
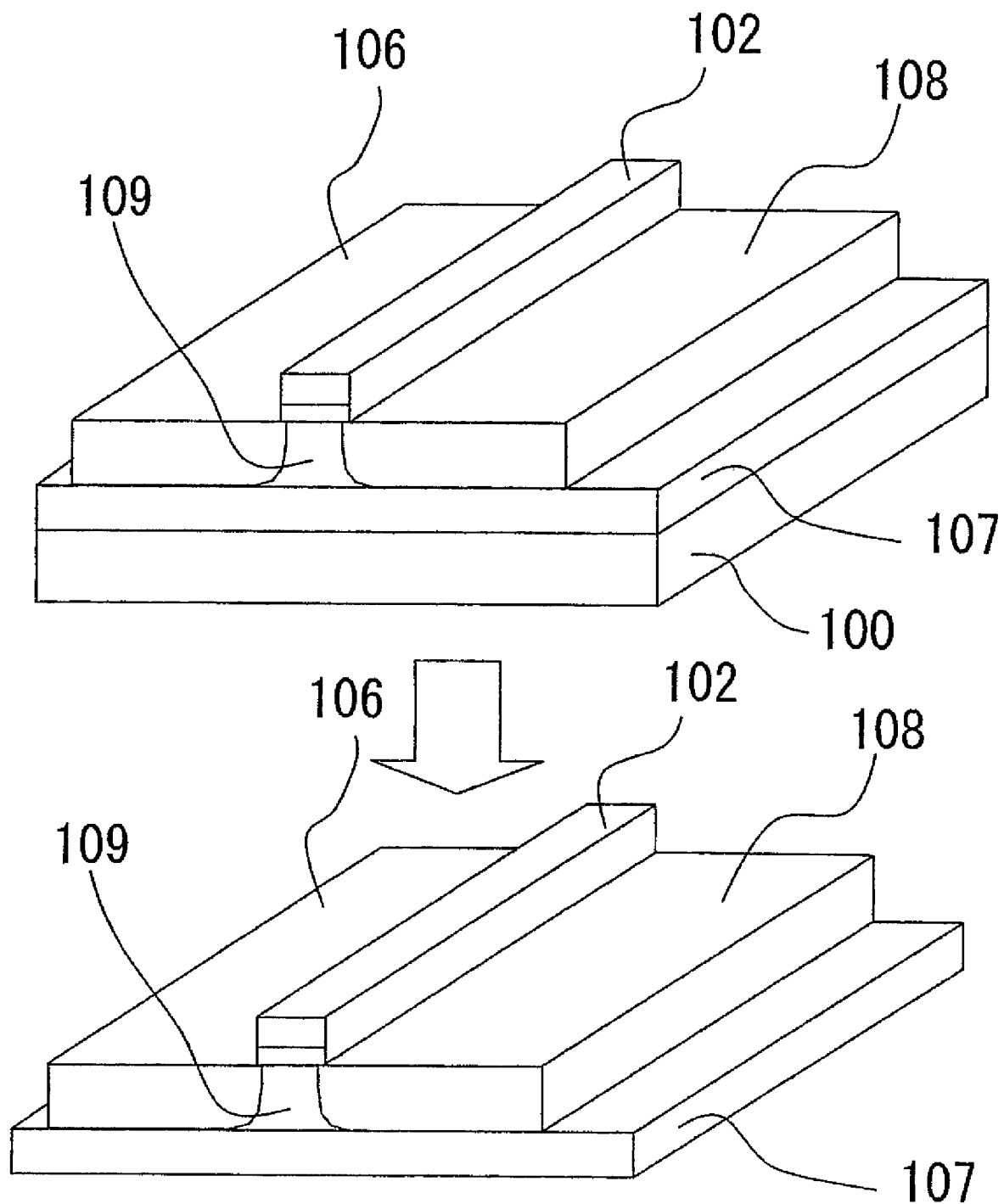
FIG. 1 is a perspective diagram for explanation of the principle of the present invention.

FIG. 1 is a diagram for explanation of the principle of the present invention.

Figure 2:
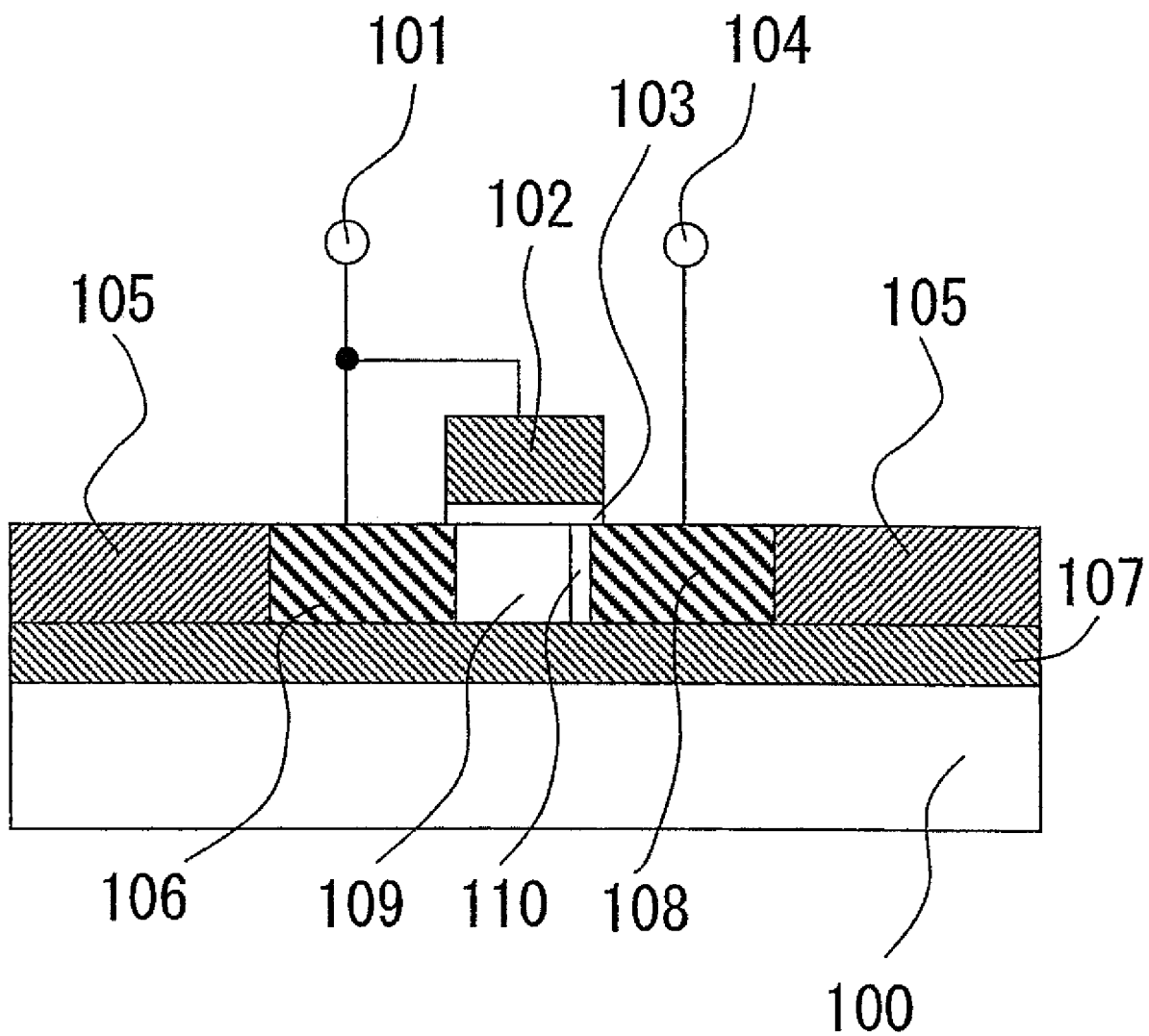
FIG. 2 is a cross-sectional diagram showing a diode-coupled MOSFET which is fabricated on an SOI substrate.
Figure 3:
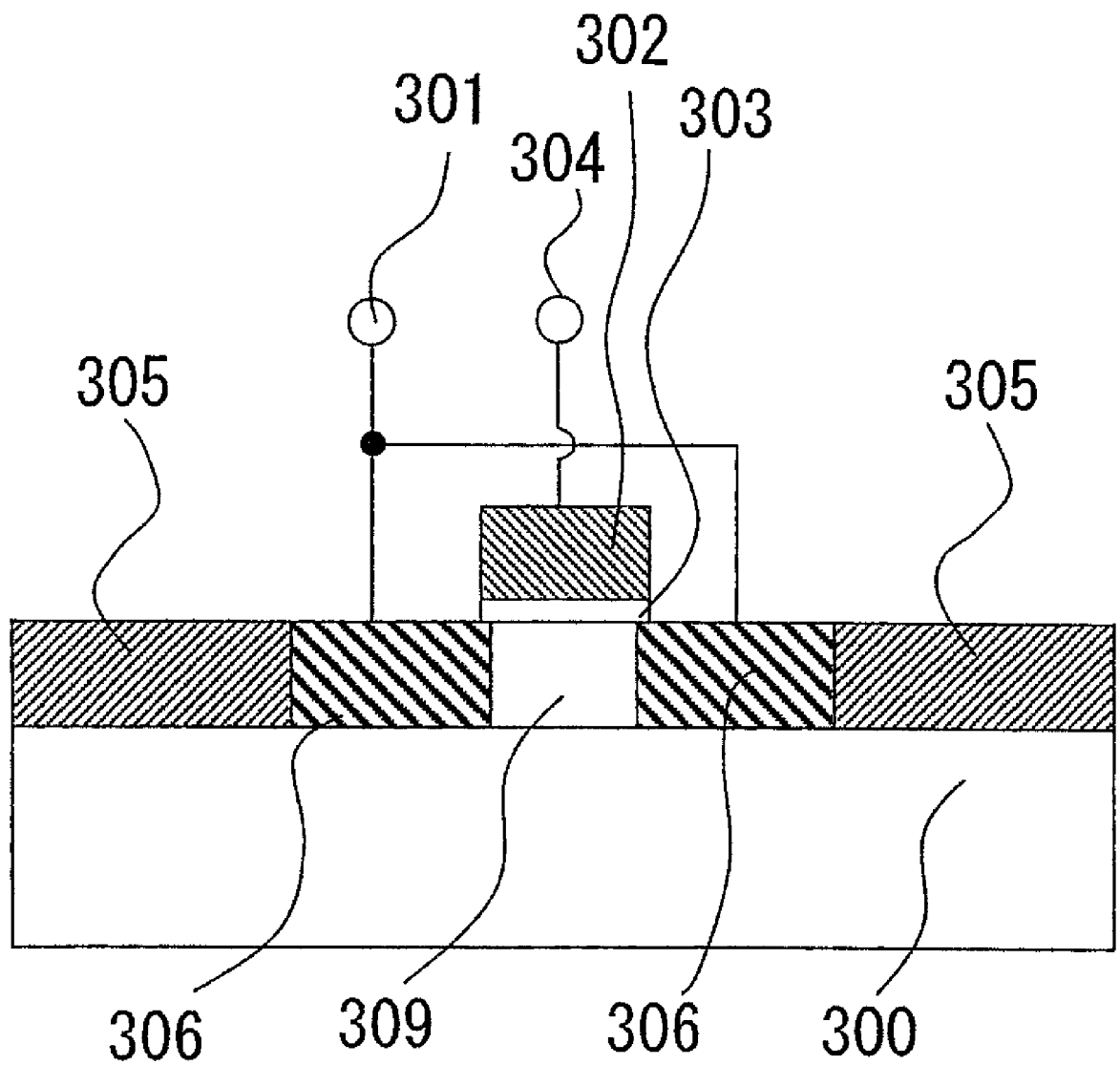
FIG. 3 is a sectional diagram showing a MOS capacitor formed on an SI substrate.
Figure 4:
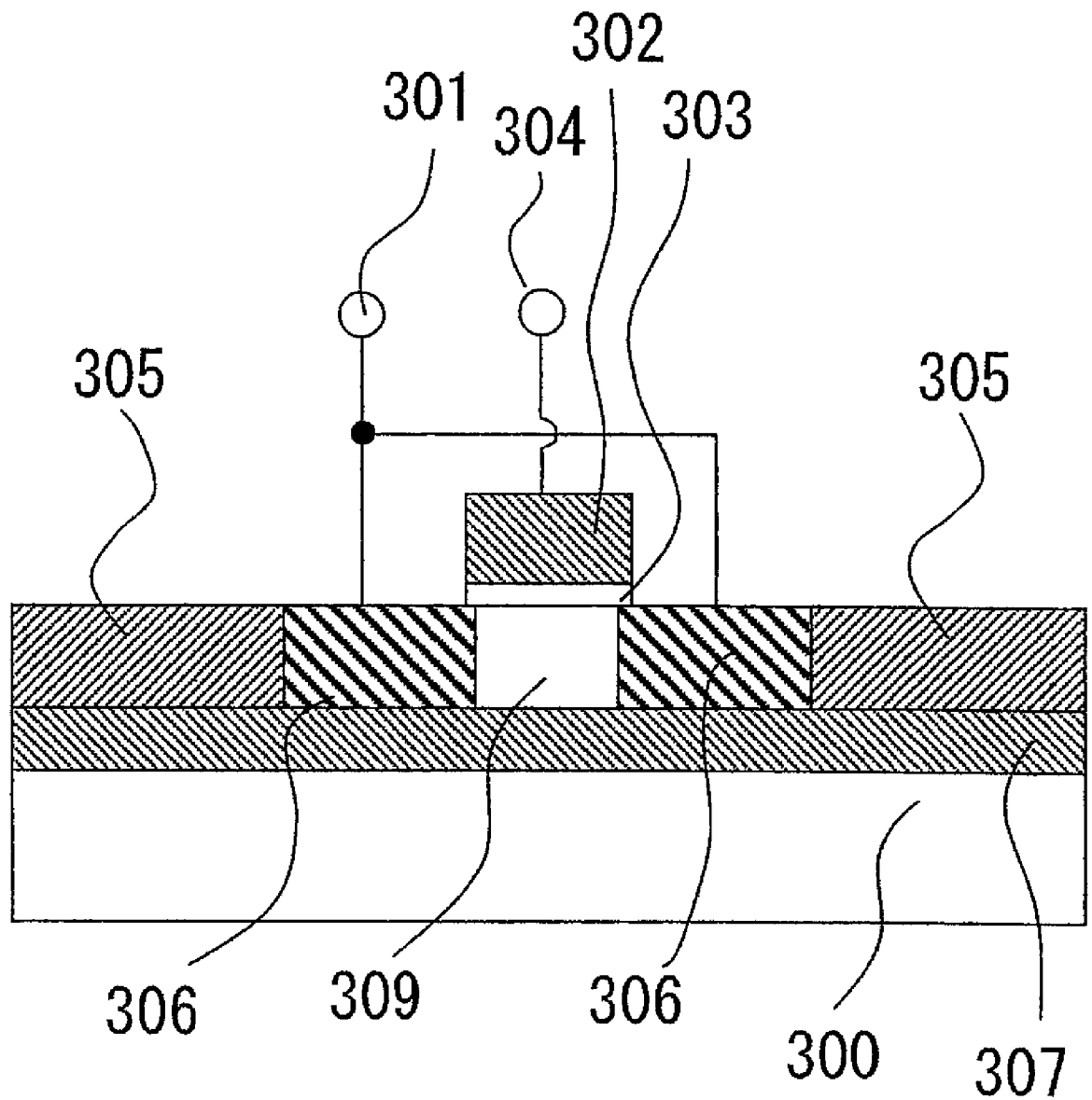
FIG. 4 is a sectional view showing a MOS capacitor formed on SOI substrate.

FIG. 1(a) depicts a MOS transistor structure in a prior known SOI wafer. Parts or components which are the same as those in FIG. 2 are denoted by the same reference numerals, with their explanations eliminated herein. A silicon substrate 100 exists beneath an oxide film 107. FIG. 1(b) shows a structure of the present invention. Any silicon substrate is not present under the oxide film 107. Here, although the oxide film 107 is designed to have a thickness ranging from 0.15 to 0.4 microns, the film thickness is selectable to fall within a range of 0.05 to 10 microns. In addition, although in FIG. 1(b) the silicon substrate is completely removed away, it is still possible to reduce leakage currents in a way depending upon conditions, even when this is left to a thickness of 0.01 to 50 microns. However, ideally, better results are obtainable when the silicon substrate is absent. Reduction of the diode's forward direction voltage advantageously makes it possible to bring about an effect as to improvements in efficiency of the rectifier circuit. The diode forward voltage is reducible by appropriately designing a gate oxide film thickness, body layer density, and an opposing length of source and drain diffusion layers. Although these are attainable by employing the same scheme as that for prior art diode structures, letting the source/drain diffusion layers increase results in an increase in depletion layer area, which leads to a steady increase in parasitic capacitance. In view of this, the presence of the oxide film 107 is effective; however, when considering about the entire circuitry of the IC chip of the electronic tag, exclusion of the parasitic capacitance that couples with the ground via the silicon substrate 100 is not negligible in an IC chip of the electronic tag which operates at high frequencies, such as for example in a range of from 800 MHz to 2.45 GHz.

Figure 5:
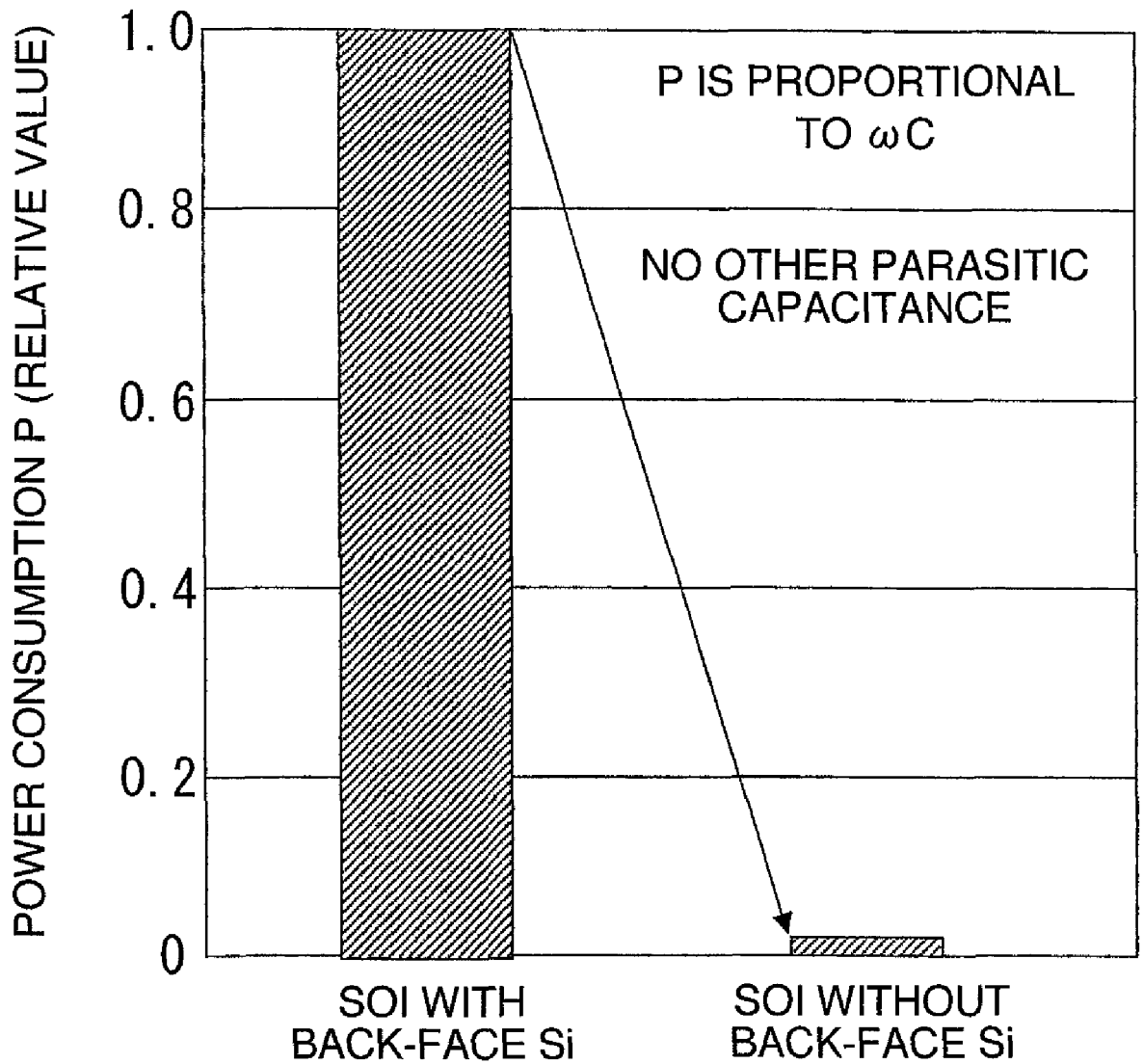
FIG. 5 is a graph showing effects of the invention.

FIG. 5 is a diagram showing effects of the invention. This diagram is a graph which relatively shows, in SOI-using IC chips of the electronic tags, power consumption of an IC chip of the electronic tag which has a back-surface silicon substrate and that of an electronic tag IC chip with the back-face silicon substrate being removed away. FIG. 5 shows theoretical values of the power consumption of the chips. Power consumption P of radio-frequency electronic tag is proportional to a product of parasitic capacitance C and frequency w. This is because the presence of the parasitic capacitance causes outflow of a current toward the ground, which in turn causes a current to flow in the substrate, resulting in the current flow being consumed as heat. This parasitic capacitance is reducible by employment of an SOI substrate; furthermore, the current outflow to the substrate is avoidable by removal of the silicon substrate. Electrical conductors (e.g., wiring leads) on a chip surface create parasitic capacitance components although these are extremely small in value, the amount of which is approximately 2 to 3 percent. Due to this, power consumption does not become completely zero. However, as shown in FIG. 5, it is possible to achieve extra-low power operability.

By removing the silicon substrate on the back surface, it becomes possible to reduce the parasitic capacitance relative to the ground to a degree of about one hundredth. Thus it is also possible to lower the power consumption to about one-hundredth. When the power consumption becomes one-hundredth, it is possible to extend the communication distance so that it is ten times greater than ever before. This can be said because the electric power from a reader of the IC chip of the electronic tag decreases in inverse proportion to the square of the distance so that an effect of the distance appears by its root even when the power consumption becomes one-hundredth. A tenfold increase of the distance means that a communication distance of 1 m becomes 10 m. Its effect is remarkable.

FIG. 6 is diagram showing an overall arrangement of the electronic tag. Usually, all of the circuitry is configurable as a single IC chip. Although its antenna part is integrally formable with the chip, it is separable from the chip when the need arises.

FIG. 6(a) shows a circuit configuration of the electronic tag. Energy is received and converted to a voltage via an antenna 601, which is applied to a capacitor 602. The capacitor 602 accumulates electrical charge with the aid of a pair of diodes 608, 603, the electrical charge being transferable to an energy accumulator 604. Meanwhile, a clock circuit 605 extracts a clock signal from the signal coming from the antenna. A power-on reset circuit 609 functions to set a memory circuit 606 to its default value. An output of the memory circuit 606 is used to cause the energy accumulator 604 to change or "offset" in state, thereby letting the antenna 601 vary in input impedance for permitting a reader to detect a change. The chip internally has a ground 607 connected as part of an antenna terminal or node.

FIG. 6(b) is a cross-sectional diagram showing a device structure at an input part of the electronic tag. A terminal from the antenna 601 and a terminal of ground 607 are capable of being taken out of the top and bottom surfaces of the chip. The capacitor 602 and diode 608 are connected together by a wiring lead 611, while the diode's gate and drain are coupled together by a wire 612. An oxide film 107 exists immediately beneath each circuit element. A though-going hole 610 of the oxide film is in a drain of the diode 608, for take-out of the ground 607. By arranging the diodes 603, 608 and the capacitor 602 of FIG. 6 using this device structure, it is possible to configure circuitry having low power consumption. It is also possible to arrange other circuits 604-606 and 609 of FIG. 6(a) to have a similar device structure. Additionally, a capacitor is utilizable as the energy accumulator 604.

Figure 7:
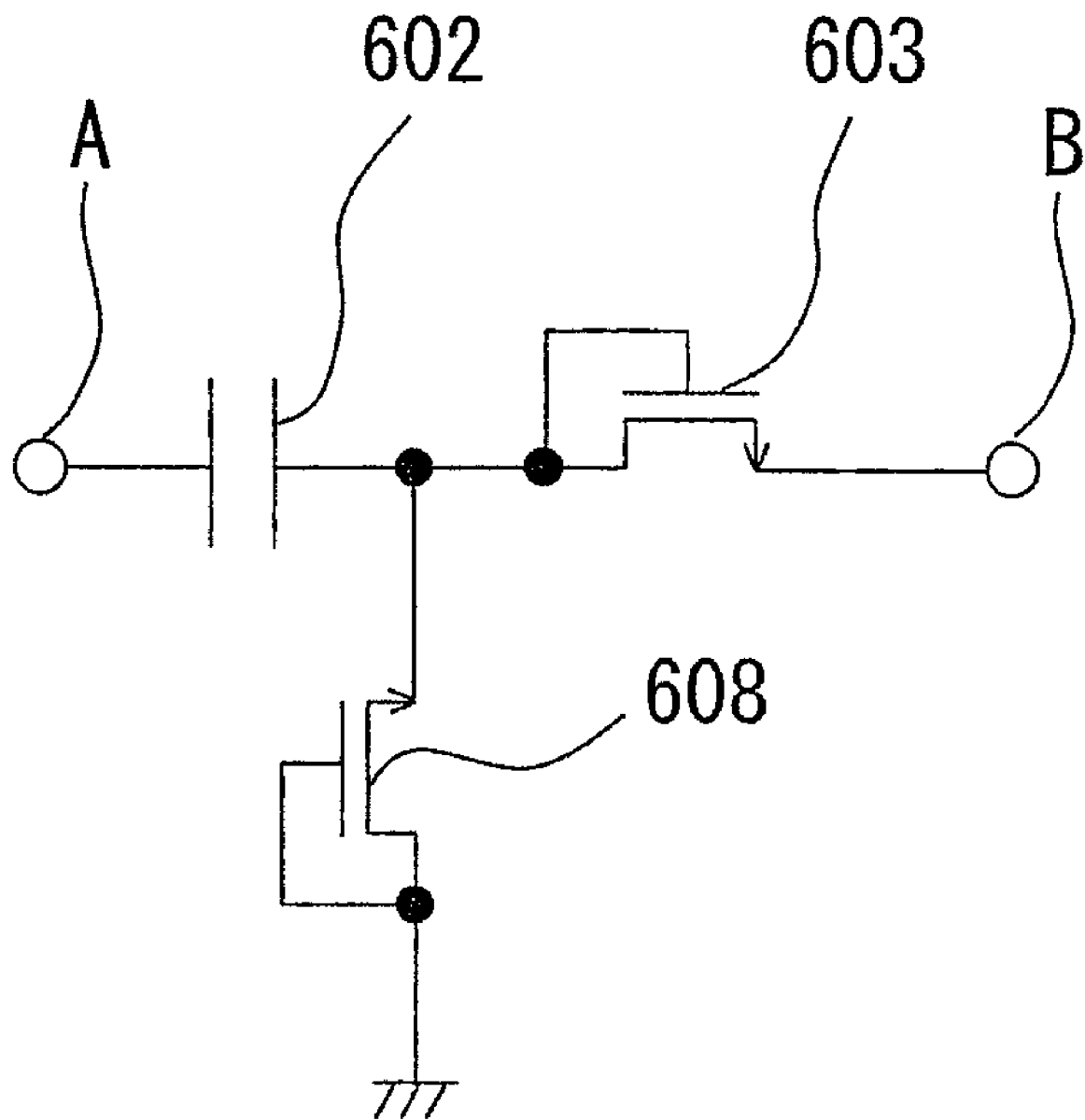
FIG. 7 is a circuit diagram showing a double-voltage rectifying circuit.

In FIG. 7, there is shown a configuration of a double-voltage rectifier circuit which is part of the circuitry shown in FIG. 6(a). An input terminal A is connected to the capacitor 602, which in turn is coupled to a MOSFET 603 and MOSFET 608. The MOSFETs 603, 608 are diode-coupled ones. A cathode of the diode 603 is for use as an output terminal B. A high-frequency voltage as applied to the input node is potentially doubled by the capacitor and diode, resulting in a voltage being generated at the output.

Figure 8:
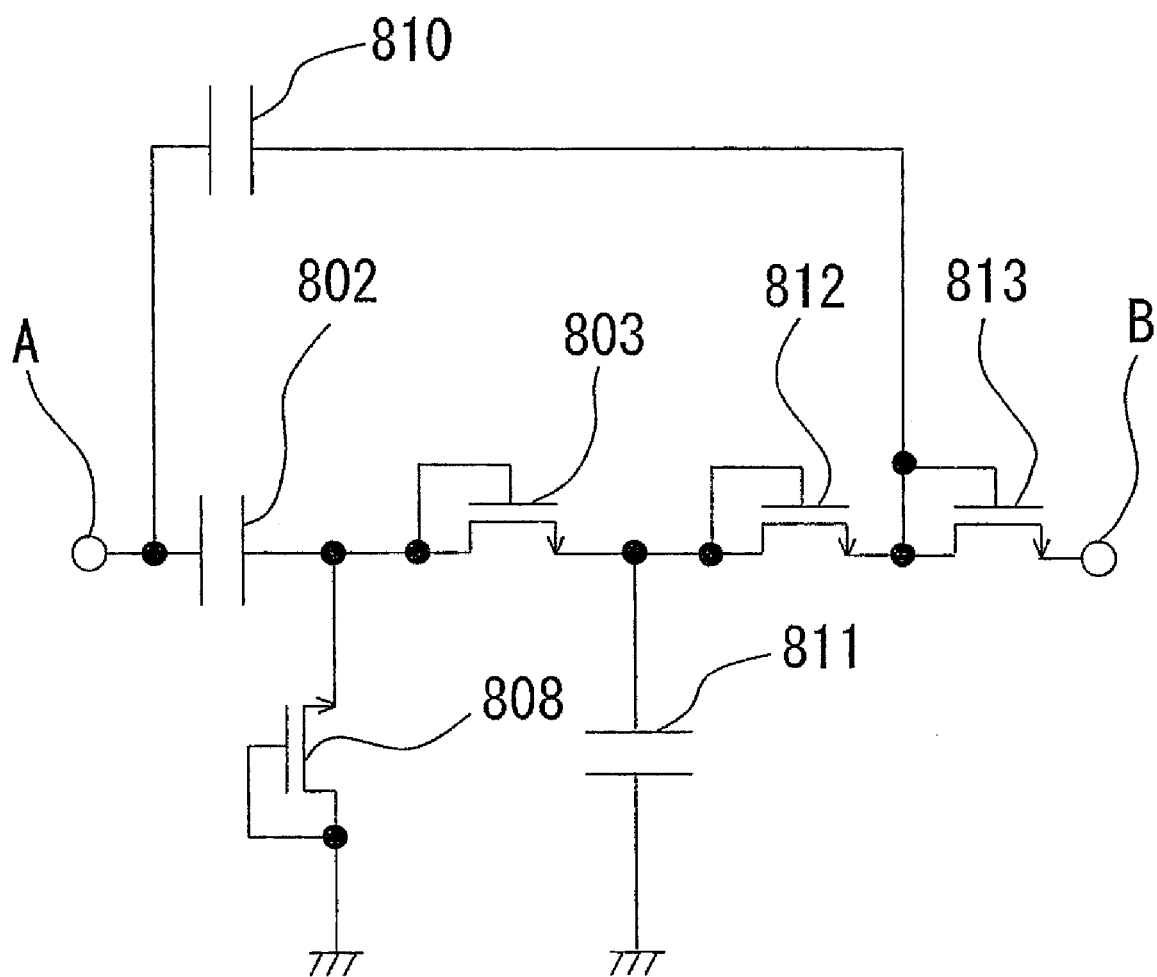
FIG. 8 is a circuit diagram showing a two-stage double-voltage rectifier circuit.

In FIG. 8, a configuration of a two-stage type double-voltage rectifier circuit is shown, which is another exemplary embodiment of the rectifier circuit. A current rectification part in FIG. 6 which is equivalent to that of FIG. 7 is replaceable by the configuration of FIG. 8. An input node A is connected to a capacitor 802, which is coupled to a MOSFET 803 and MOSFET 808. These MOSFETs 803, 808 are diode-coupled ones. Another capacitor 810 is coupled to the input node A, with its output being connected to a MOSFET 812 and MOSFET 813. MOSFETs 812,813 are diode-coupled ones. A source of MOSFET 813 is an output node B of the exemplary rectifier circuit. A capacitor 811 is connected to an output of MOSFET 803. This rectifier circuit is the one that retains at the capacitor 811 an output voltage of a double-voltage rectifier circuit at the first stage and further adds a voltage by a double-voltage rectifier circuit at the second stage.

In this embodiment it is possible to extend the communication distance of the electronic tag for the reasons which follow. Firstly, in order to extend the communication distance of the electronic tag, it is important to reduce the power consumption of the electronic tag chip. Those parts that operate at high frequencies are the rectifier circuit and the clock circuit, which are carrier frequency-operable circuits. On the other hand, the internal memory circuit operates at a lower frequency which is about one ten-thousandth the carrier frequency. As the power consumption of the electronic tag chip is proportional to the product of an operational frequency and parasitic capacitance, it is effective, in order to lower the power consumption, to reduce the parasitic capacitance relative to the ground of each element of the rectifier circuit and clock circuit with high frequency operation. The parasitic effect with the ground is not negligible since semiconductor chips are often such that a substrate is grounded. The parasitic capacitance is determinable by the dielectric constant and the thickness of a depletion layer if the element area is kept identical. Supposing that the dielectric constant is about a threefold difference between the silicon and the oxide film and that the depletion layer thickness is about twenty times different therebetween, the SOI substrate is about sixty times different in parasitic capacitance from ordinary or standard silicon substrates, which suggests that the SOI substrate is significantly effective for parasitic capacitance reduction. The reduction of the parasitic capacitance means a decrease in power consumption of the electronic tag chip. This power consumption decrease means expansion of the communication distance.

Figure 9:
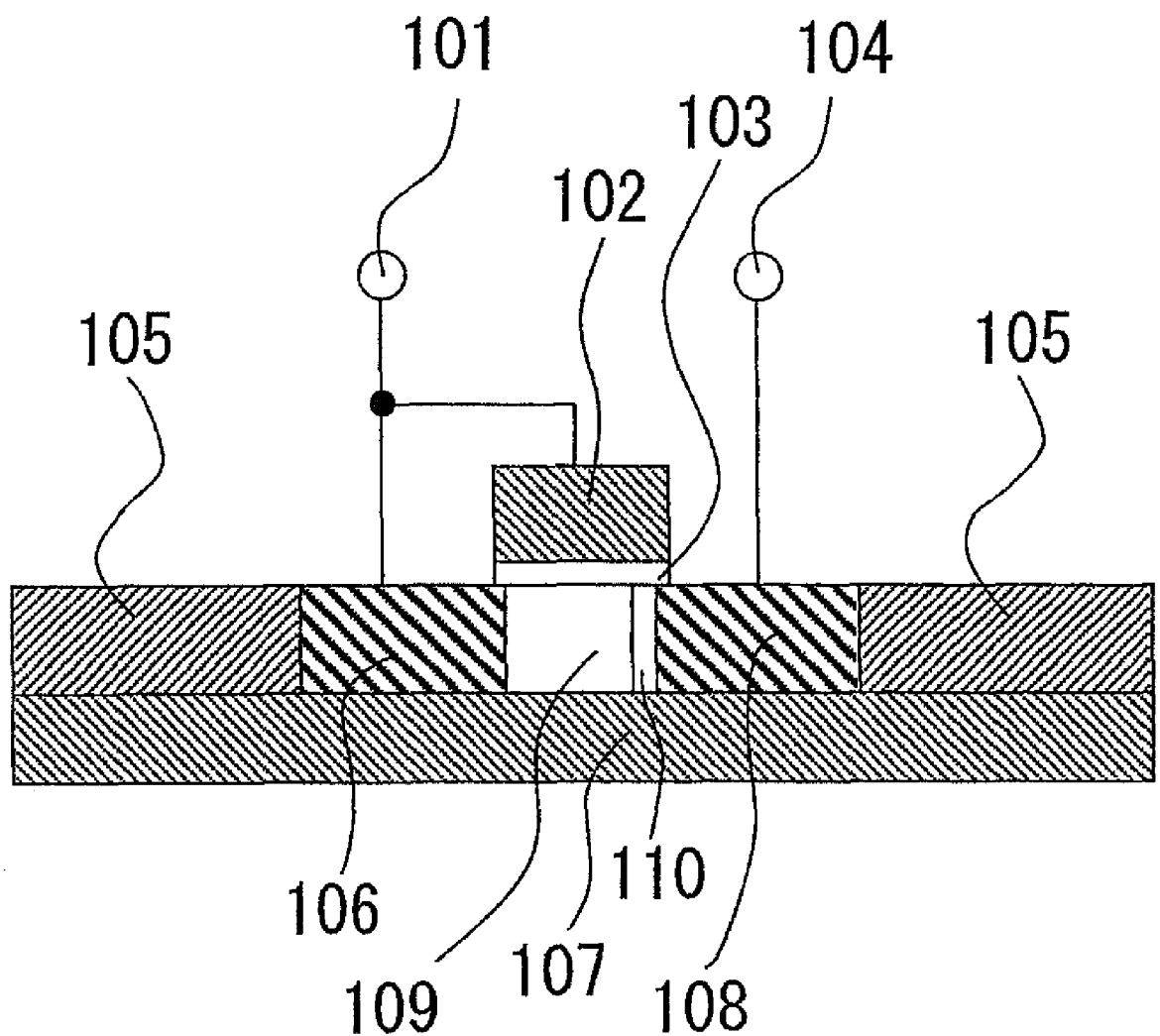
FIG. 9 is a sectional diagram showing a configuration of a diode-coupled MOSFET.

FIG. 9 is a diagram showing an exemplary configuration of the diode-coupled MOSFET (e.g., MOSFET 703, 803) of FIGS. 7, 8 in accordance with an embodiment of the present invention. An anode 101 is connected to a polysilicon 102 and a drain diffusion layer 106. A gate oxide film 103 plays an important role for determination of the forward voltage of a diode. A diode current flows from the anode 101 to a cathode 104 through a source diffusion layer 108. The diode is separated by an element isolation film 105. An oxide film 107 shown herein is a buried oxide film of SOI wafer. A body layer 109 plays an important role for determining the forward voltage of the diode. The body layer 109 is connected to the drain diffusion layer 106, thereby enabling the function of lowering the diode's forward voltage. A depletion layer 110 takes place between the body layer 109 and source diffusion layer 108 when the diode with its anode 101 being set to a minus voltage and with its cathode 104 to a plus voltage is at a reverse voltage. The depletion layer serves as a parasitic capacitance component and becomes a factor for leakage current production when using the diode at radio frequencies. Although in the prior art a silicon layer underlies the oxide film 107, the present invention is such that the silicon layer is removed away to ensure that the resulting device has no parasitic capacitance coupling with ground via the drain diffusion layer 106, body layer 109, source diffusion layer 108 and silicon layer.

An n+ layer as provided in the drain diffusion layer 106 and source diffusion layer 108 may be designed to have its depth ranging from 0.01 to 3 microns while letting a distance between the n+ layer and oxide film fall within a range of 0.01 to 3 microns. A reason for this is as follows: due to the ability to freely control the reduction of parasitic capacitance by the oxide film thickness, it is required for certain conditions, such as the depth of n+ layer and the distance between the n+ layer and oxide film, to retain the selectivity from the viewpoint of a device breakdown voltage. To reduce the ground-related parasitic capacitance, it is effective to enlarge the thickness of the oxide film 107.

Figure 10:
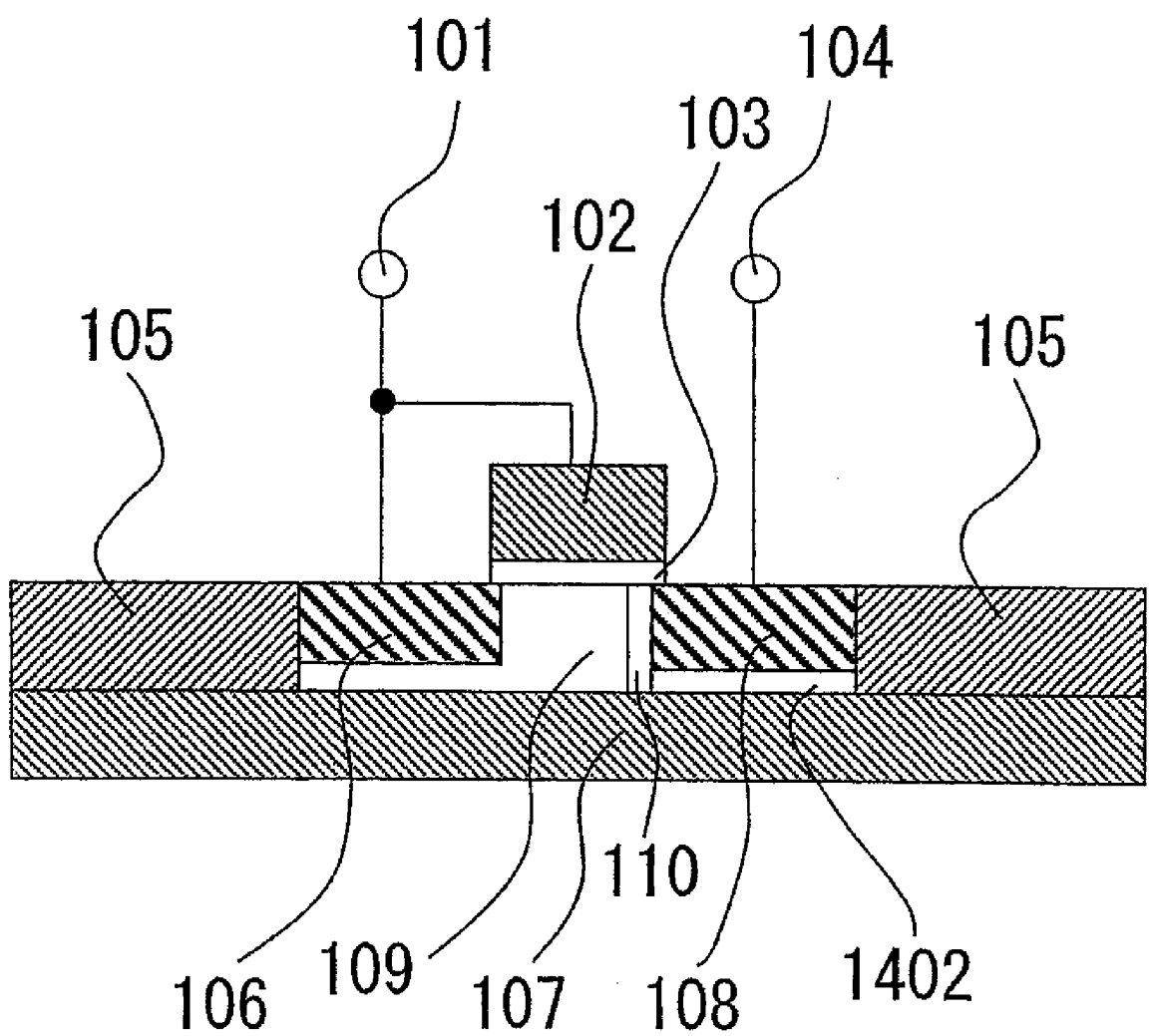
FIG. 10 is a sectional diagram showing a configuration of another diode-coupled MOSFET.

FIG. 10 is a diagram showing another diode structure in the present invention. The same parts or components as those of FIG. 9 are designated by the same reference numerals, with explanations thereof eliminated herein. In a MOS transistor structure overlying an SOI, a transistor of the type having a completely depleted layer and a partial depletion type transistor are present. The present invention is effective for either one of these cases. In the complete depletion type, it is possible to improve the threshold characteristics of a transistor without the presence of any neutral region in the body layer 109.

Alternatively in the partial depletion type, it is also possible to control a body voltage, which also makes it possible to lower the threshold voltage. Even in case the source diffusion layer 108 and drain diffusion layer 106 are not connected to the oxide film 107 as in JP-A-2000-299440, the invention is effective. At this time, as shown in FIG. 10, a depletion layer 1402 generates at a bottom surface of the source diffusion layer 108. This depletion layer 1402 yields an effect that the oxide film 107 virtually increases when the layer reaches the oxide film 107, which leads to a decrease in parasitic capacitance; however, if a silicon substrate exists as in the prior art then it couples with ground via such silicon substrate, thereby unintentionally becoming a leakage current creation factor. Arranging the diode while removing the silicon substrate as in the present invention is effective for achieving low power operability of the IC chip of the electronic tag.

Figure 11:
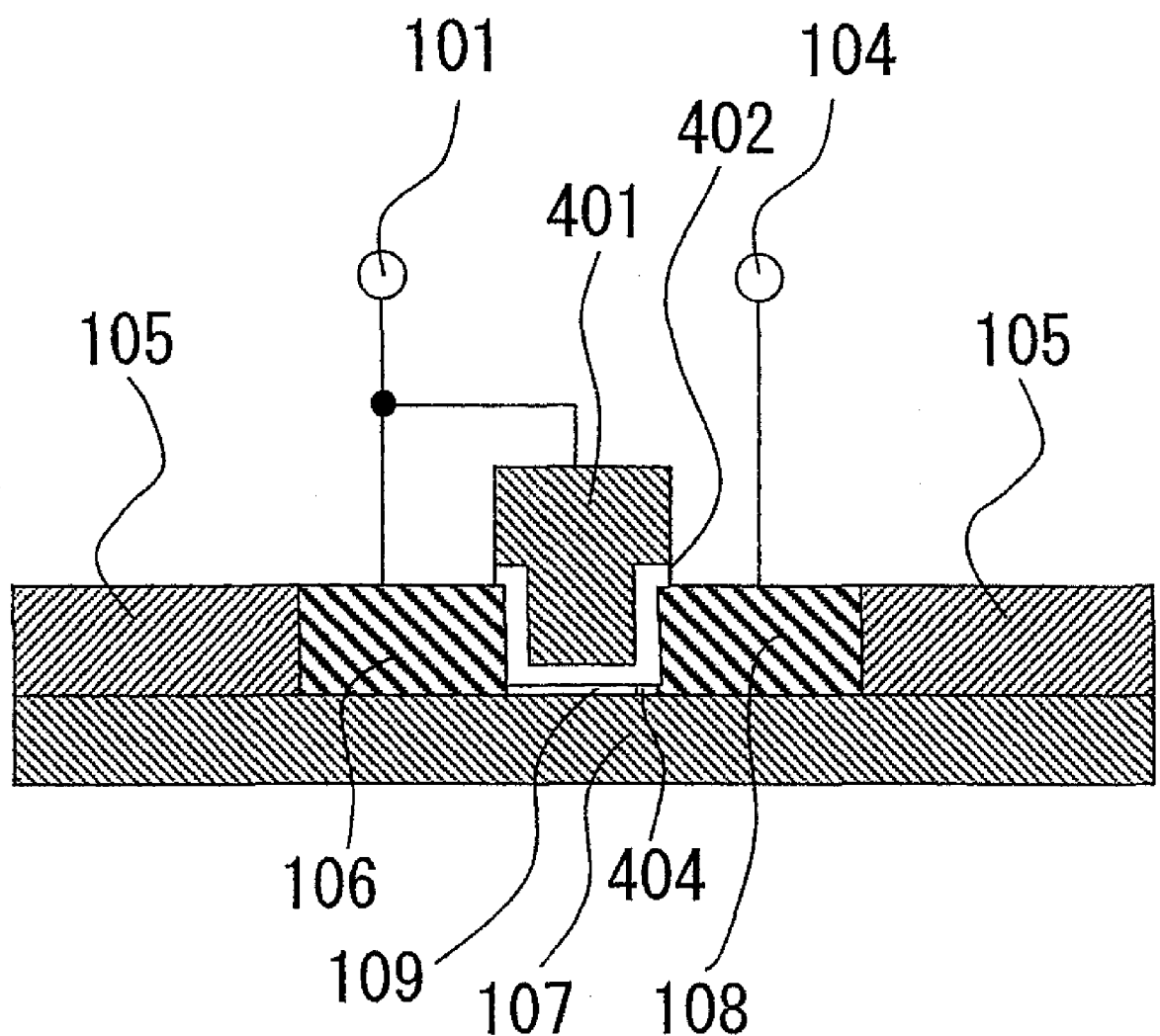
FIG. 11 is a sectional diagram showing a configuration of still another diode-coupled MOSFET.

FIG. 11 is a diagram showing another diode structure of the invention. Similar components to those of FIG. 9 are denoted by the same numerals, with their explanations omitted herein. As previously stated, it is important to reduce the diode's parasitic capacitance in the IC chip of the electronic tag. Another means for reducing the parasitic capacitance is to reduce the opposing area of electrodes which form a capacitor, thereby enabling reduction. In the example of FIG. 11, a gate oxide film 402 plays an important role for determination of the forward voltage of the diode. A diode current flows from an anode 101 to a cathode 104 via a source diffusion layer 108. A characteristic feature is that a gate oxide film 402 is formed at sidewalls of the source diffusion layer 108 and drain diffusion layer 106. Thus it becomes possible to reduce the opposing area of a depletion layer 404, which in turn makes it possible to achieve reduction of the parasitic capacitance occurring due to such depletion layer.

FIG. 12 shows a fabrication process of the present invention. Exemplified here is a manufacturing process of the device shown in FIG. 6. Like numerals are used to indicate like components.

As shown in FIG. 12(a), a device structure has on its back surface a silicon substrate 301 having a terminal from an antenna 601, which is formed on a wafer with an oxide film 107 being sandwiched therebetween. Shown herein is a cross-sectional diagram immediately after completion of a structure in which a capacitor 602 and a diode 608 are connected together by a wiring lead 611 with a MOS gate and drain of the diode are coupled by a wire 612.

FIG. 12(b) shows a cross-sectional diagram immediately after a process for completion of a structure which is strongly reinforced by applying an adhesive 1200 and a reinforcing substrate 1201 to a principal surface side of the wafer thus completed in FIG. 12(a).

FIG. 12(c) shows a sectional diagram immediately after a process subsequent to FIG. 12(b) for removing the back-face silicon substrate 301 by using an etchant which dissolves silicon but does not dissolve silicon oxides, such as a potassium hydroxide, ammonia, sydrazine or equivalents thereof. The wafer's principal surface side is protected by a support substrate 1201 and the adhesive 1200 and thus is protected against these etchants.

FIG. 13 shows an entire structure of an electronic tag of the type having a double-face electrode structure. FIG. 13(a) is a cross-sectional view thereof. FIG. 13(b) is a plan view thereof.

An upper-side antenna 1301 and a lower-side antenna 1302 are connected together in such a way as to interpose therebetween a double-face electrode chip 1305 having an upside electrode 1303 and a downside electrode 1304.

Using the double-face electrode structure permits the electronic tag chip to have a single electrode on each of its top and bottom surfaces, resulting in an increase in tolerance with respect to positional deviation, rotation and up-and-down inversion of the chip. Thus it becomes possible to handle in unison and simultaneously assemble a plurality of small-size chips, thereby enabling manufacture of the electronic tags at low cost.

Figure 14:
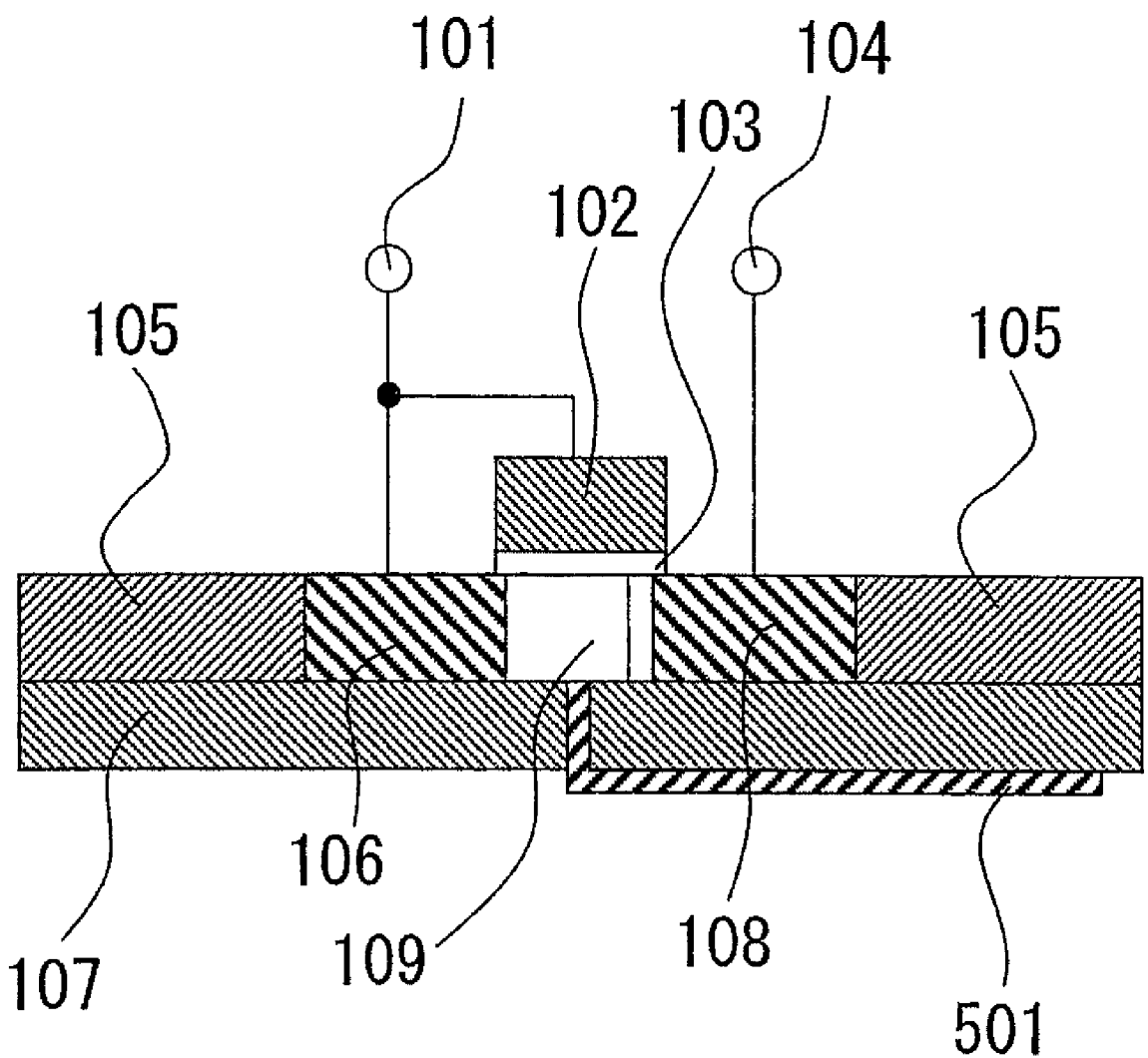
FIG. 14 is a sectional diagram showing a diode-coupled MOSFET with an electrode taken out of its back surface.

FIG. 14 is a diagram showing a diode-coupled MOSFET of the type having an electrode as taken out of its back surface, which also embodies the invention. Shown here is a cross-sectional diagram of a diode structure with a back-face silicon substrate being removed away. The same components as those of FIG. 9 are designated by the same numerals, with their explanations eliminated herein. A back-face outgoing lead 501 is connected to a drain diffusion layer 109 via a through-going hole formed in an oxide film 107 to thereby take out an electrode on the back surface. This back-face electrode is for use as an antenna connection terminal and is capable of functioning, together with a top-face electrode, as a double-face electrode type IC chip of the electronic tag.

A fabrication process of the double-face electrode structure will be explained with reference to FIG. 15. The same parts as those of FIG. 13 is denoted by the same numerals with their explanations omitted herein.

In FIG. 15(a), there is shown a cross-sectional view of a state that an electronic tag chip 1305 having the double-face electrode structure is attached by adsorption at a jig 1601 which has a vacuum suction hole 1602. A double-face electrode chip is mounted by positioning to a lower-side antenna 1302, a cross-section of which is shown in FIG. 15(b). Additionally, FIG. 15(c) shows in cross-section a state that an upper-side antenna is subject to positioning above the double-face electrode. FIG. 15(d) depicts a cross-section immediately after a process for connecting the upper-side antenna to an upside electrode of the double-face electrode. Although the assembly of only one piece of the double-face electrode electronic tag chip is shown in these drawings, it is important for establishment of low-cost assembly to assemble two to 10,000 or more of multiple electronic tag chips at a time, and the present invention is effective in formation of such low-cost electronic tags. While it is described that the electronic tag chip structure of the invention is formed from a wafer having a lamination structure of silicon layers with an oxide film sandwiched therebetween, similar results are obtainable even in several structures which employ an insulator for covering the back surface of a silicon thus completed—the invention does not impede realization of such structures.

Figure 16:
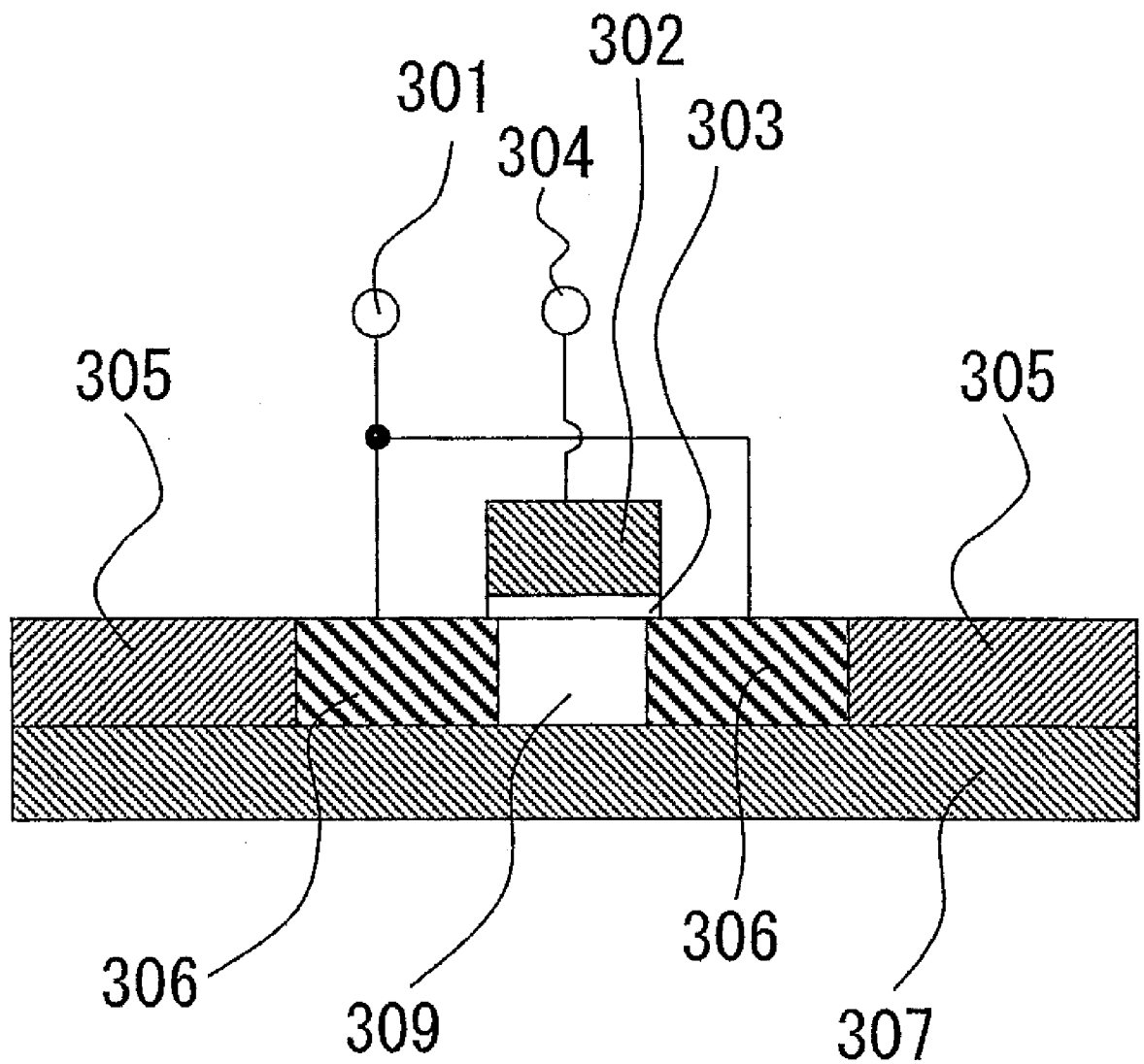
FIG. 16 is a sectional diagram showing a MOS capacitor of rectifier circuitry.

FIG. 16 is a diagram showing a MOS capacitor of the present invention. A first MOS capacitor electrode 301 is connected to an N-type diffusion layer 306, while a second MOS capacitor electrode 304 is coupled to a polysilicon 302, with a gate oxide film 303 being formed beneath it. The N-type diffusion layer 306 is separated by an isolation oxide film 305. An oxide film 307 underlies an N-type channel layer 309 and the N-type diffusion layer 306. A prior known silicon substrate is removed away. Owing to this, in case the first MOS capacitor electrode 301 is used as the input terminal of the capacitor of the rectifier circuit in FIG. 2, no parasitic effects take place even when the N-type diffusion layer 306 is set to a minus potential. Accordingly, the first MOS capacitor electrode 301 is set at a minus potential and the second MOS capacitor electrode 304 becomes a plus potential, resulting in establishment of a potential which enables it to effectively function as a MOS capacitor. Because of the removal of the silicon substrate, parasitic capacitance hardly occurs between the N-type diffusion layer 306 and N-type channel layer 309 on one hand and the ground on the other hand. Thus it is possible to achieve low power operability of the structure for use as an IC chip of the electronic tag.

Figure 17:
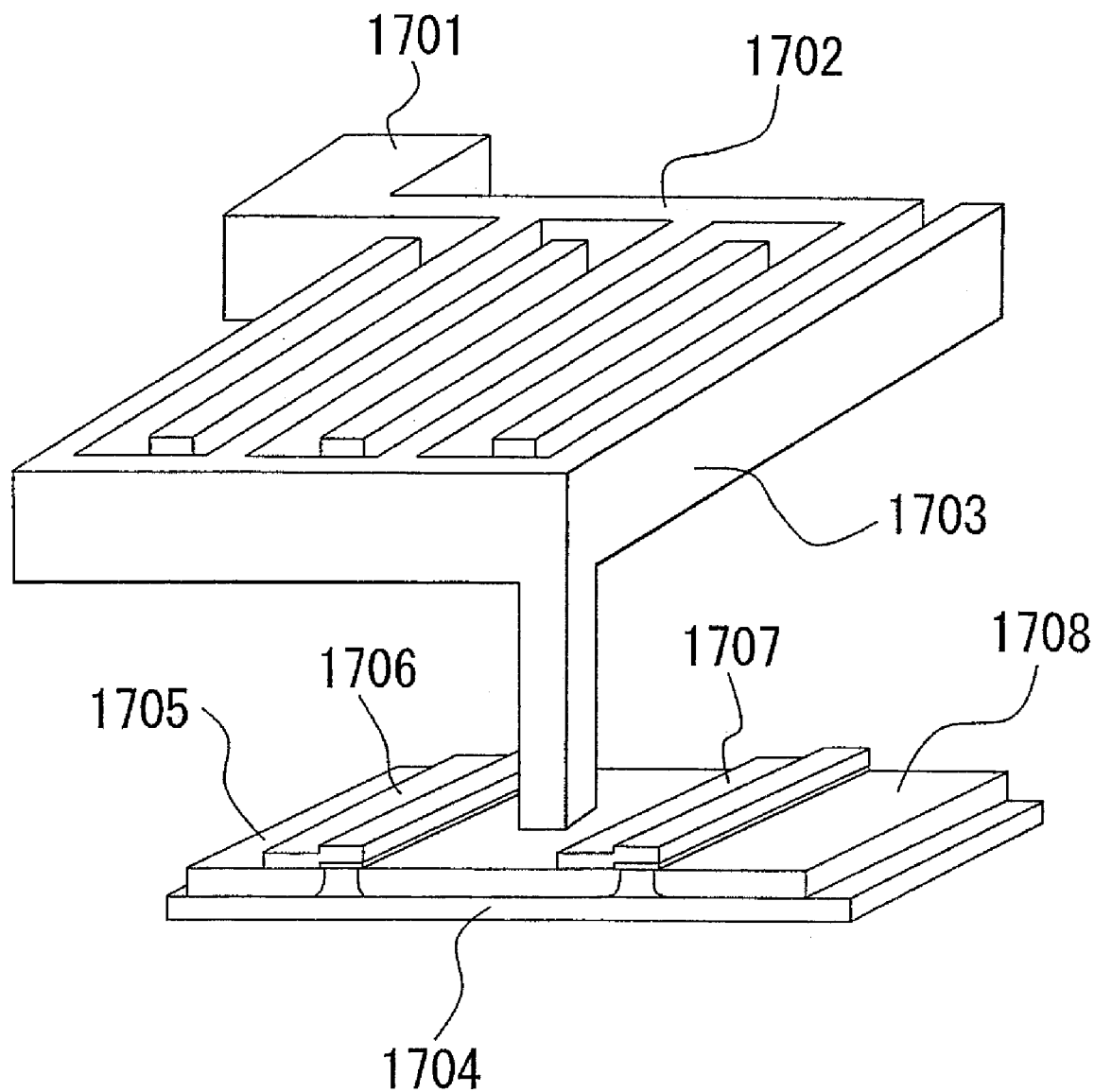
FIG. 17 is a perspective view of a capacitor structure using an electrical wiring lead(s).

FIG. 17 is a diagram showing a capacitor structure using wiring leads. This capacitor is characterized in that it is formed by a wiring process in semiconductor fabrication processes. An antenna connection terminal 1701 connected to a first wired capacitor sidewall 1702. This sidewall is formed to oppose a second wired capacitor sidewall 1703. A diode underlies the wiring with the second wired capacitor sidewall 1703 being connected to a common electrode 1709. The diode consists essentially of a first diode electrode 1705, a first diode, a second diode 1707 and a second diode electrode. An oxide film 1704 underlies these diodes. With advances in miniaturization of the semiconductor wiring process, it is possible to form a sidewall-utilizing wired capacitor while minimizing its size dimensions. This wired capacitor exhibits no polarity dependency and is capable of obtaining preferable properties when used as a capacitor for realizing rectifier circuitry of the electronic tag IC chips of FIGS. 6 through 8. In addition, it is possible by taking a distance between the wired capacitor and diode to achieve a capacitor that is less in parasitic capacitance with the ground. This makes it possible to permit the IC chip of the electronic tag to decrease in power consumption.

INDUSTRIAL APPLICABILITY

The present invention as disclosed and claimed herein is utilizable to IC chips for use in electronic tags or equivalents thereto.

The invention claimed is:

1. A semiconductor device comprising:
    a silicon chip substrate;
    a buried oxide film formed on the silicon chip substrate;
    an IC chip formed over the buried oxide film, and having a front surface and a rear surface and including a MOS component selected from a group constituting a MOS diode and a MOS capacitor which is operable as a rectifying circuit, an upper side electrode and a lower side electrode respectively formed on the front and the rear surfaces of the IC chip; and
    an upper side antenna element and a lower side antenna element,
    wherein the upper side antenna element is arranged to be connected with the upper side electrode, and the lower side antenna element is arranged to be connected with the lower side electrode
    wherein the silicon substrate is deleted after the IC chip is formed, and
    wherein the lower side electrode is arranged to be taken out via a through hole formed in the buried oxide film.

2. The semiconductor device as recited in claim 1, wherein a diffusion layer of the MOS component reaches the buried oxide film.

3. The semiconductor device as recited in claim 1, wherein a side wall having been formed within the IC chip is arranged to be operable as a capacitor of the rectifying circuit.

* * * * *